(12) United States Patent
Bentley et al.

(10) Patent No.: US 7,677,109 B2
(45) Date of Patent: Mar. 16, 2010

(54) PRESSURE SENSE DIE PAD LAYOUT AND METHOD FOR DIRECT WIRE BONDING TO PROGRAMMABLE COMPENSATION INTEGRATED CIRCUIT DIE

(75) Inventors: Ian Bentley, New Ipswich, NH (US); Alistair D. Bradley, Dublin, OH (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/038,156

(22) Filed: Feb. 27, 2008

(65) Prior Publication Data

US 2009/0212093 A1    Aug. 27, 2009

(51) Int. Cl.
*G01L 7/00* (2006.01)
(52) U.S. Cl. .................. 73/756; 73/754; 257/432
(58) Field of Classification Search .......... 73/756, 73/754; 257/432; 438/107
See application file for complete search history.

(56) References Cited

U.S. PATENT DOCUMENTS

| | | | |
|---|---|---|---|
| 5,225,373 A | 7/1993 | Takahashi et al. | |
| 6,058,782 A | 5/2000 | Kurtz et al. | 73/727 |
| 6,209,398 B1 | 4/2001 | Fowler, Jr. et al. | 73/724 |
| 6,577,224 B2 | 6/2003 | Kurtz | 338/42 |
| 6,691,581 B2 | 2/2004 | Kurtz et al. | 73/754 |
| 6,732,588 B1 | 5/2004 | Mullenborn et al. | 73/715 |
| 6,756,248 B2 | 6/2004 | Ikeda et al. | 438/53 |
| 6,756,316 B1 | 6/2004 | Bothra et al. | 438/745 |
| 7,231,827 B2 | 6/2007 | Kumpfmuller | 73/706 |
| 7,434,474 B1 * | 10/2008 | DuPuis | 73/756 |
| 2006/0248957 A1 | 11/2006 | Vas et al. | 73/754 |
| 2007/0238215 A1 | 10/2007 | Stewart et al. | 438/53 |
| 2007/0256501 A1 | 11/2007 | Kurtz et al. | 73/780 |
| 2008/0277782 A1 * | 11/2008 | Chen et al. | 257/724 |

FOREIGN PATENT DOCUMENTS

| JP | 09-092670 A | 4/1997 |
|---|---|---|
| JP | 3627693 B2 | 12/2004 |

* cited by examiner

*Primary Examiner*—Andre J Allen

(57) ABSTRACT

A method for direct die-to-die wire bonding incorporates a pressure sense die and a programmable compensation IC die that can be mounted on a ceramic substrate. The two die can be positioned beside each other such that wire bond pads on the pressure sense die and bonding leads on the compensation IC die are in same order. The pressure sense die and the compensation IC can be connected directly with wire bonds in order to reduce the number of wire bonds and to improve reliability. The pressure sense die can be designed with multiple wire bond pad patterns in order to be utilized with different programmable compensation IC dies.

19 Claims, 3 Drawing Sheets

PRESSURE SENSE DIE PAD LAYOUT AND METHOD FOR DIRECT WIRE BONDING TO PROGRAMMABLE COMPENSATION INTEGRATED CIRCUIT DIE

TECHNICAL FIELD

Embodiments are generally related to sensor devices and components. Embodiments are also related to pressure sensors that incorporate IC (Integrated Circuit) components. Embodiments are additionally related to methods for direct die-to-die wire bonding.

BACKGROUND OF THE INVENTION

Many processes and devices have been used in the field of pressure sensing. Pressure sensors are generally used and deployed wherever a need for monitoring and responding to pressure changes is necessary. Pressure sensors are commonly used in a variety of automotive, aerospace, commercial, industrial, and consumer applications.

The operational environments in which pressure sensors are required to operate in these applications with high accuracy and repeatability can be very demanding. For example, extreme thermal conditions including thermal shocks in ranges from 150 C to −55 C, and extreme conditions of shock and vibration.

Pressure sensors may typically include a substrate, a silicon pressure sense die with a diaphragm movable in response to pressure programmable compensation IC die, a cover to enclose the diaphragm, and terminals extending through some part of the base or cover to supply power and to measure a pressure signal. The programmable compensation IC die can be utilized for adjusting the output of the sensor die to obtain the pressure signal. In such a configuration, wire bonds can be utilized to provide an electrical connection between bonding pads on a top surface of the silicon sense die and compensation IC die and conductor paths on the ceramic substrate.

In the majority of prior art applications, the silicon pressure sense die is bonded to the compensation integrated circuit die by bonding each die separately to the ceramic substrate and utilizing traces on the substrate to connect the two die. Hence, these wire bonds require area on the ceramic substrate for bond pads which increases the number of the wire bonds. Two wire bonds, with an intervening conductive trace on the ceramic substrate are required to make each connection between the pressure sense die and the programmable compensation IC. The inductance of the connective path increases as the length of the path increases. The increase in the number and length of the wire bonds further increases package size and manufacturing cost. Further, the reliability of the sensor can also be affected by the number of wire bonds required. In general, it is desirable to reduce the length and number of the wire bonds and conductive traces utilized to connect the pressure sense die wire bond pads to the compensation integrated circuit die.

Based on the foregoing it is believed that a need exists for an improved method for direct die-to-die wire bonding. It is also believed that a need exists for an improved pressure die pad layout that is compatible with different compensation integrated circuit dies.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the present invention to provide for improved sensor devices and components.

It is another aspect of the present invention to provide for improved pressure sensor die pad layout that is compatible with different compensation IC dies.

It is further aspect of the present invention to provide for improved methods for direct die-to-die wire bonding.

The aforementioned aspects and other objectives and advantages can now be achieved as described herein. A method for direct die-to-die wire bonding incorporates a pressure sense die and a programmable compensation IC (Integrated Circuit) die that can be mounted on a ceramic substrate. The two die can be positioned beside each other such that wire bond pads on the pressure sense die and bonding leads on the compensation IC die are sufficiently close to each other to wire bond directly between the two die. For this to be possible, the bond pads must be in the same order. The pressure sense die and the compensation IC can be connected directly with wire bonds in order to reduce the number of wire bonds and improve reliability. The pressure sense die can be designed with multiple wire bond pad patterns in order to be utilized with different programmable compensation IC dies. The method and pressure sense die layout as disclosed in greater detail herein reduces the number of wire bonds required to connect the pressure sense die and the compensation IC die.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

Figure 1:
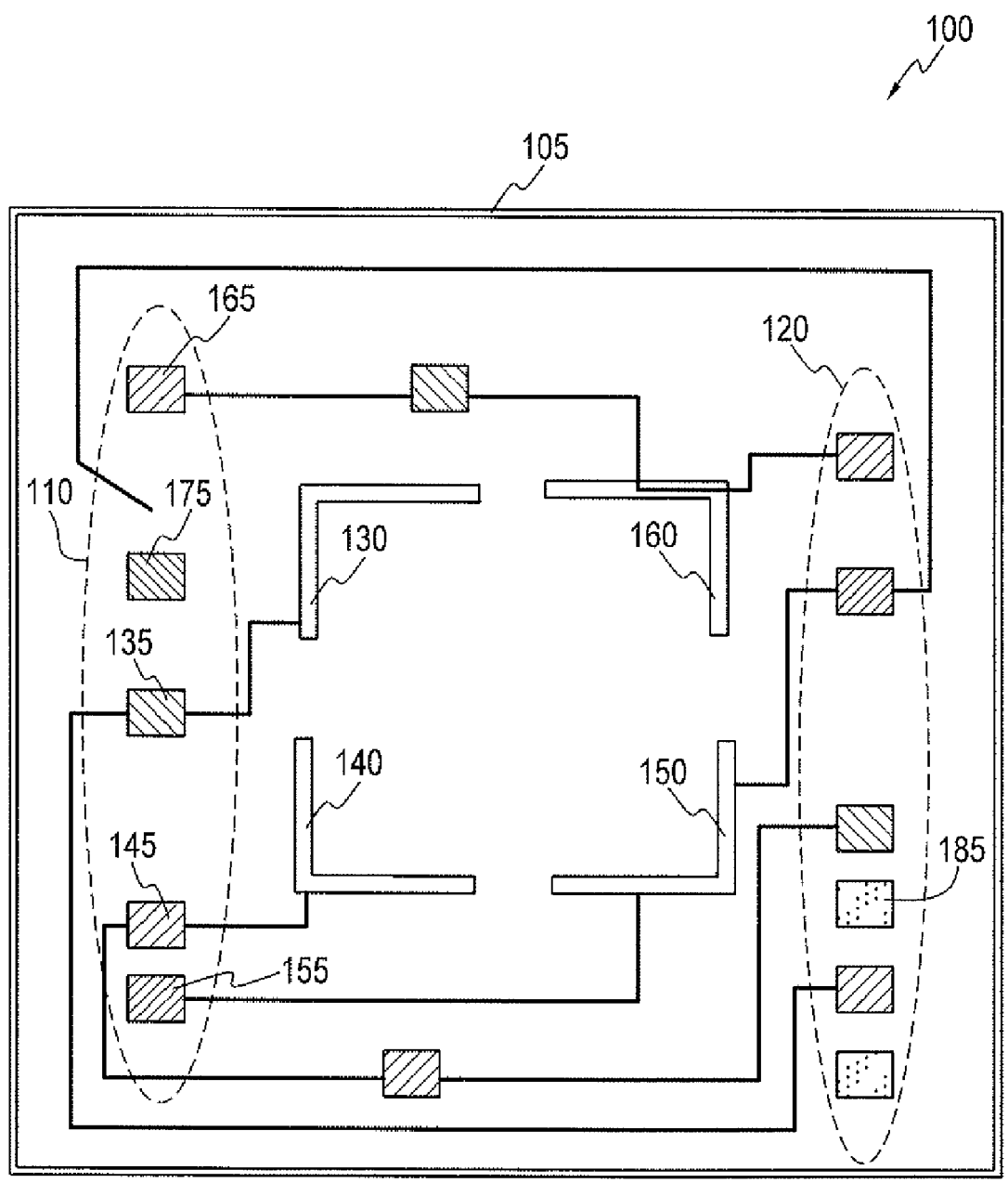
FIG. 1 illustrates a top view of a pressure sense die pad layout for direct die-to-die bonding, which can be implemented in accordance with a preferred embodiment.

Referring to FIG. 1, a top view of a pressure sense die pad system 100 for direct die-to-die bonding is illustrated, which can be implemented in accordance with a preferred embodiment. The system 100 depicted in FIG. 1 generally incorporates a pressure sense die 105 that includes a first set of wire bond pad pattern 110 and a second set of wire bond pad pattern 120, each formed on opposite sides of the pressure sense die 105. The bond pad patterns 110 and 120 of system 100 can be formed of a variety of materials, such as aluminum, gold or copper. The first set of wire bond pad pattern 110 includes signal bond pads 145, 165, 175 and power supply bond pads 135 and 155. Additionally, the bond pads may take a variety of configurations, including shapes other than that depicted in FIG. 1.

Note that the term "power supply" as utilized herein is intended to include both power and ground. The pressure sense die 105 includes only a few representative bonding pads however, it should be understood that the pressure sense die 105 can possess a multiplicity of both signal bond pads and power supply bond pads. Similarly, the second set of wire bond pad pattern 120 also includes signal bond pads 145, 165, 185 and power supply bond pads 135 and 155. The pressure sense die 105 further includes bonding lines 130, 150, 140 and 160 for the power supply bond pads 135 and 155 and signal bond pads 145 and 165 respectively.

The pressure sense die pad system 100 includes bond pads only along the edges for illustrative purpose of clarity however, bond pads can also be provided along the remaining edges of the die 105 so that the sense die 105 can be compatible with different programmable compensation IC dies. Bond pads on the pressure sense die can provide signals other than pressure, bond pads 175 and 185 could be connected to a diode device that provides a signal proportional to temperature, for example.

Figure 2:
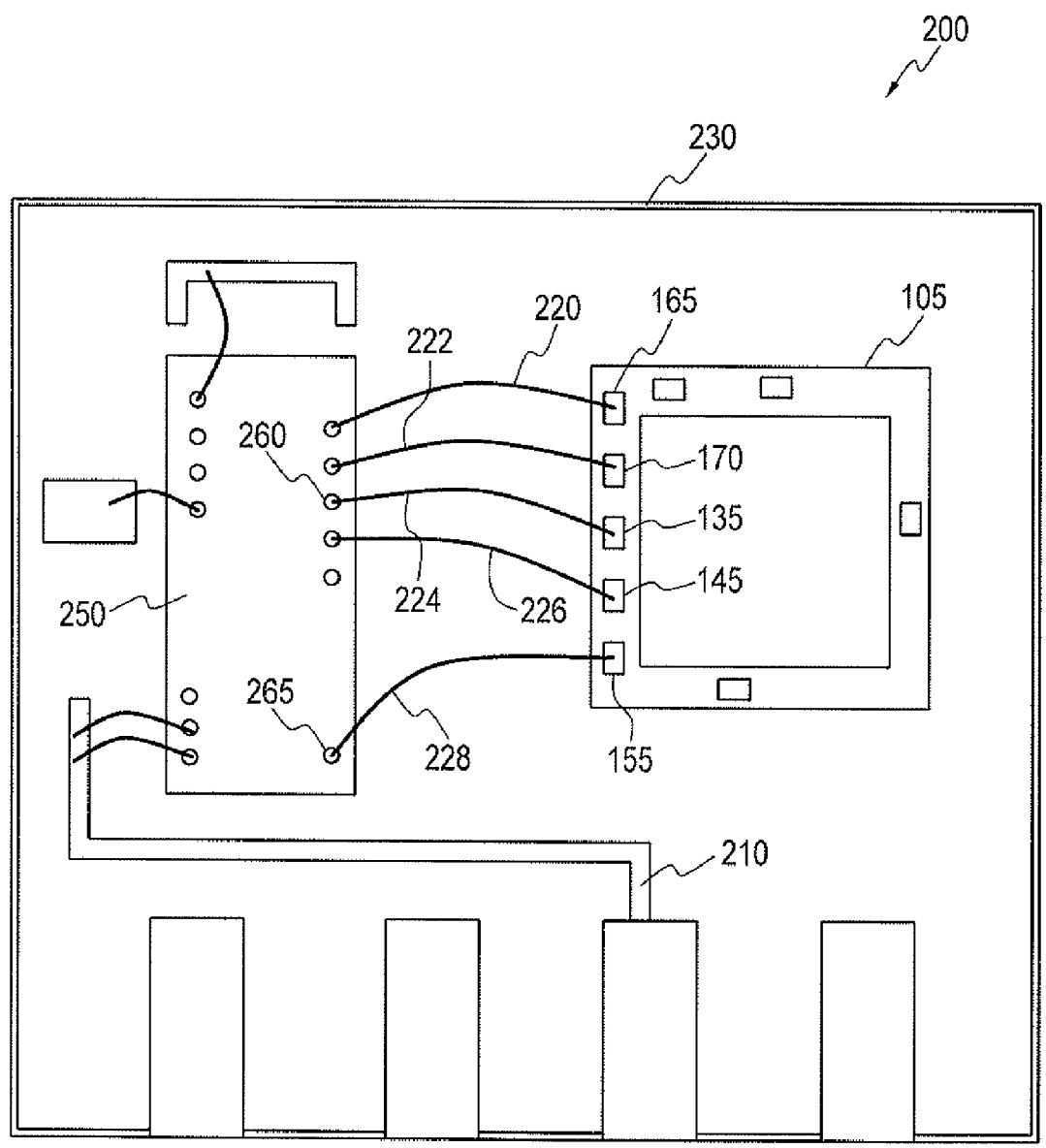
FIG. 2 illustrates a top view of a pressure sensor apparatus with the pressure sense die and a programmable compensation IC die, which can be implemented in accordance with a preferred embodiment.

Referring to FIG. 2, a top view of a pressure sensor apparatus 200 with the pressure sense die 105 and programmable compensation IC die 250 is illustrated, in accordance with a preferred embodiment. The pressure sensor apparatus 200 includes a base ceramic layer 230 with conductive traces 210. The conductive traces 210 may be of any suitable conductive metals, which can be screened onto the base ceramic layer 230, but are preferably gold, palladium-silver or other metallization materials with wire-bondable surface finishing.

The pressure sense die 105 such as shown in FIG. 1 can be mounted onto the base ceramic layer 230 with an adhesive. The adhesive attaches the pressure sense die 105 directly onto the base ceramic layer 230. The pressure sense die 105 possess a number of bond pads 135, 145, 155, 165 and 170 for the purpose of making electrical connections and can be mounted such that the bond pads 135, 145, 155, 165 and 170 are exposed.

A programmable compensation IC die 250 can be mounted on the ceramic substrate 230 as depicted in FIG. 2. The compensation IC die 250 may comprise a memory chip or a processor chip, or other type of integrated circuit. Typically, compensation IC die 250 includes a substrate, usually of silicon, but other or additional materials can be used. The exact nature of the compensation IC die 250 can be varied within the scope of the present invention. The pressure sense die 105 and the programmable compensation IC die 250 can be positioned beside each other such that the wire bond pads 135, 145, 155, 165 and 170 are in the same order as those on the programmable compensation IC die 250. This minimizes routing complexity between the pressure sense die 105 and the programmable compensation IC die 250.

The bond pads 135, 145, 155, 165 and 170 of the pressure sense die 105 can be connected to respective bonding leads of the programmable compensation IC die 250 on a one-to-one basis utilizing bond wires 220, 222, 224, 226 and 228. For example, the power supply-bonding pad 135 and 155 on the pressure sense die 105 can be electrically connected to a power supply-bonding leads 260 and 265 of the programmable compensation IC die 250 with wire bonds 224 and 228. Very thin bond wires usually formed of aluminum or gold can be utilized to connect the bond pads on the pressure sense die 105 on a one-for one basis with the bond leads on the integrated circuit die 250. In this way, electrical connections can be established from the bond pads to the package leads.

Figure 3:
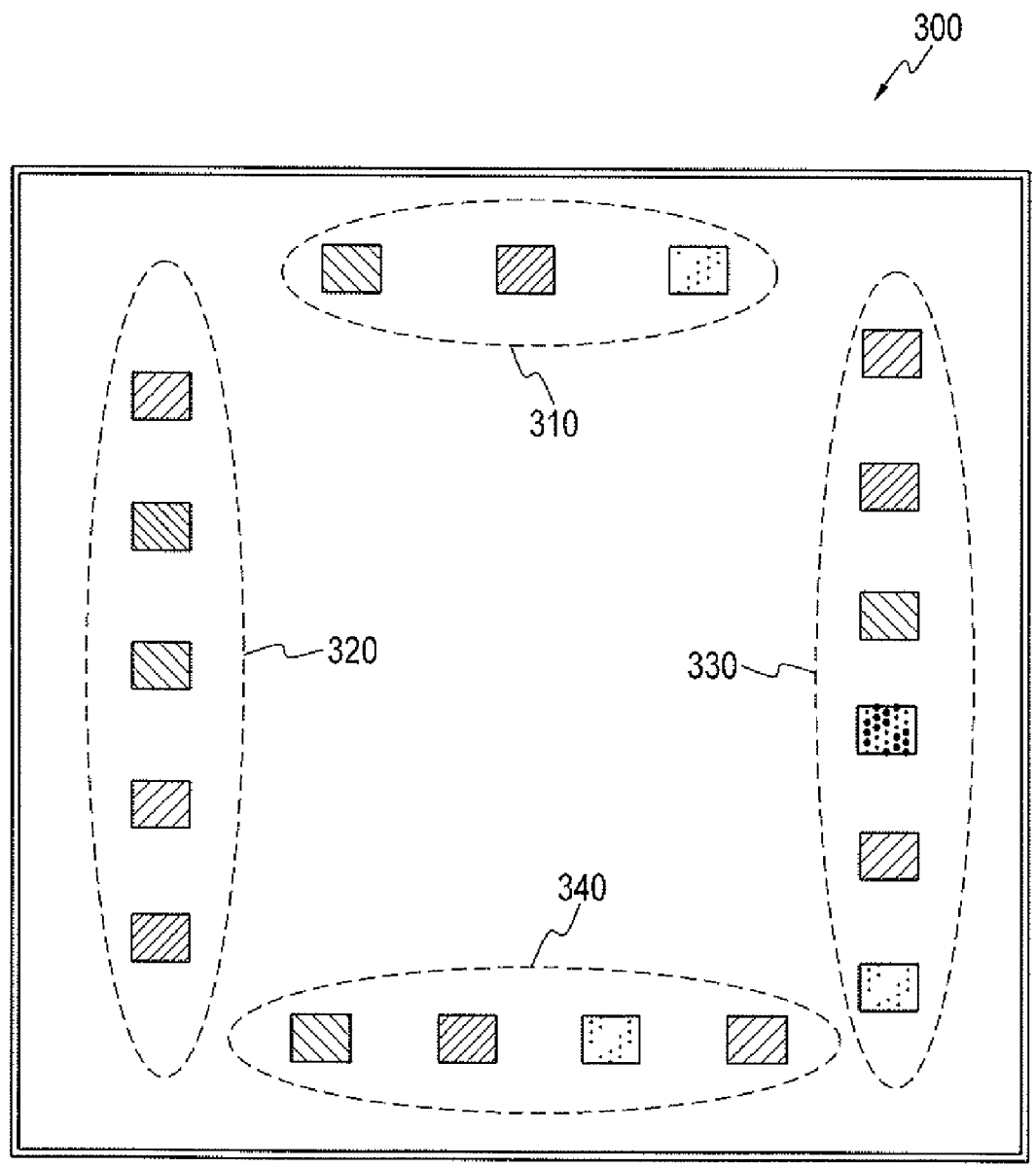
FIG. 3 illustrates a top view of a pressure sense die pad layout, which can be implemented in accordance with an exemplary embodiment.

Referring to FIG. 3 a top view of a pressure sense die pad layout 300 is illustrated, which can be implemented in accordance with an exemplary embodiment. The pressure sense die pad 300 includes four sets of wire bond pad patterns 310, 320, 330 and 340 on all four sides of the pressure sense die 300. The pressure sense die 300 can be compatible with four different programmable compensation IC dies in order to directly connect the two die with wire bonds. The four sets of wire bond pad patterns 310, 320, 330 and 340 includes only a few representative wire bond pads for purposes of clarity and specificity however, additional bond pads can also be added to the four sets of wire bond pad patterns 310, 320, 330 and 340.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A method for direct die-to-die wire bonding, comprising;
   mounting a pressure sense die to a ceramic substrate, wherein said pressure sense die comprises at least one wire bond pad pattern associated with a plurality of wire bond pads and a programmable compensation IC die that includes a plurality of bonding leads;
   positioning said pressure sense die and said programmable compensation IC die beside each other, such that said plurality of wire bond pads associated with said pressure sense die and said plurality of bonding leads of said programmable compensation IC die are arranged in a same order; and
   electrically connecting each of at least two of said plurality of wire bond pads to corresponding said plurality of bonding leads associated with said programmable compensation IC die directly with at least one wire bond.

2. The method of claim 1 further comprising:
   configuring said pressure sense die with said at least one wire bond pad pattern such that said pressure sense die is compatible with a plurality of bonding leads of each of a plurality of different compensation IC dies.

3. The method of claim 1 wherein said plurality of wire bond pads comprises at least one signal bonding pad and at least one power supply bonding pad on said pressure sense die.

4. The method of claim 1 wherein said at least one wire bond pad pattern are formed from a group comprising at least one of the following: aluminum, gold and copper.

5. The method of claim 1 further comprising:
   configuring said pressure sense die with said at least one wire bond pad pattern such that said pressure sense die is compatible with a plurality of different compensation IC dies, wherein said plurality of wire bond pads comprises at least one signal bonding pad and at least one power supply bonding pad on said pressure sense die.

6. The method of claim 5 wherein said at least one wire bond pad pattern is formed from aluminum.

7. The method of claim 5 wherein said at least one wire bond pad pattern is formed from gold.

8. The method of claim 5 wherein said at least one wire bond pad pattern is formed from copper.

9. An apparatus for direct die-to-die wire bonding, comprising;
   a pressure sense die mounted to a ceramic substrate, said pressure sense die comprising at least one wire bond pad pattern associated with a plurality of wire bond pads and a programmable compensation IC die that includes a plurality of bonding leads;

wherein said pressure sense die and said programmable compensation IC die are positioned beside each other, such that said plurality of wire bond pads associated with said pressure sense die and said plurality of bonding leads of said programmable compensation IC die are arranged in a same order; and wherein said plurality of wire bond pads are electrically connected to corresponding ones of said plurality of bonding leads associated with said programmable compensation IC die directly with at least one wire bond.

10. The apparatus of claim 9 wherein said pressure sense die is configured with said at least one wire bond pad pattern such that said pressure sense die is compatible with a plurality of different compensation IC dies.

11. The apparatus of claim 9 wherein said plurality of wire bond pads comprises at least one signal bonding pad and at least one power supply bonding pad on said pressure sense die.

12. The apparatus of claim 9 wherein said at least one wire bond pad pattern are formed from a group comprising at least one of the following: aluminum, gold and copper.

13. The apparatus of claim 9 wherein said pressure sense die includes said at least one wire bond pad pattern, such that said pressure sense die is compatible with a plurality of compensation IC dies, and wherein said plurality of wire bond pads comprises at least one signal bonding pad and at least one power supply bonding pad on said pressure sense die.

14. The apparatus of claim 13 wherein said at least one wire bond pad pattern is formed from aluminum.

15. The apparatus of claim 13 wherein said at least one wire bond pad pattern is formed from gold.

16. The apparatus of claim 13 wherein said at least one wire bond pad pattern is formed from copper.

17. An apparatus for direct die-to-die wire bonding, comprising;

a pressure sense die mounted to a ceramic substrate, said pressure sense die comprising at least one wire bond pad pattern associated with a plurality of wire bond pads and a programmable compensation IC die that includes a plurality of bonding leads;

wherein said pressure sense die and said programmable compensation IC die are positioned beside each other, such that said plurality of wire bond pads associated with said pressure sense die and said plurality of bonding leads of said programmable compensation IC die are arranged in a same order;

wherein each of at least two of said plurality of wire bond pads are electrically connected to a corresponding one of said plurality of bonding leads associated with said programmable compensation IC die directly with at least one wire bond; and wherein said pressure sense die is configured with said at least one wire bond pad pattern such that said pressure sense die is compatible with a plurality of different compensation IC dies.

18. The apparatus of claim 17 wherein said plurality of wire bond pads comprises at least one signal bonding pad and at least one power supply bonding pad on said pressure sense die.

19. The apparatus of claim 17 wherein said at least one wire bond pad pattern are formed from a group comprising at least one of the following: aluminum, gold and copper.

* * * * *